United States Patent [19]

Gaertner et al.

[11] Patent Number: 4,904,362
[45] Date of Patent: Feb. 27, 1990

[54] BAR-SHAPED MAGNETRON OR SPUTTER CATHODE ARRANGEMENT

[75] Inventors: Walter Gaertner; Franz Koroschetz, both of Gmunden; Alfred Wagendristel, Perchtoldsdorf; Herwig Bangert, Vienna, all of Austria

[73] Assignee: Miba Gleitlager Aktiengesellschaft, Laakirchen, Austria

[21] Appl. No.: 221,383

[22] Filed: Jul. 19, 1988

[30] Foreign Application Priority Data

Jul. 24, 1987 [AT] Austria .................................. 1881/87
Sep. 1, 1987 [AT] Austria .................................. 2193/87

[51] Int. Cl.[4] ............................................. C23C 14/34
[52] U.S. Cl. .................................. 204/192.12; 204/298
[58] Field of Search ...................... 204/192.12, 192.15, 204/192.16, 298 CS, 298 TS, 298 CM, 298 CX, 298 SC, 298 MO

[56] References Cited

U.S. PATENT DOCUMENTS

| | | | |
|---|---|---|---|
| 3,682,969 | 8/1972 | Fischbein et al. | 204/192.16 |
| 3,725,238 | 4/1973 | Fischbein et al. | 204/298 TS |
| 3,829,969 | 8/1974 | Fischbein et al. | 30/346.54 |
| 4,272,355 | 6/1981 | Kennedy | 204/298 TS |

FOREIGN PATENT DOCUMENTS

| | | | |
|---|---|---|---|
| 3030329 | 2/1982 | Fed. Rep. of Germany | 204/298 TS |
| 3030320 | 3/1982 | Fed. Rep. of Germany | 204/298 TS |
| 63-235471 | 9/1988 | Japan | 204/298 TS |
| 2049737 | 12/1980 | United Kingdom | 204/298 TS |

*Primary Examiner*—Aaron Weisstuch
*Attorney, Agent, or Firm*—Beveridge, DeGrandi & Weilacher

[57] ABSTRACT

The invention relates to a bar-shaped magnetron-sputter cathode arrangement having an internal, cooled permanent magnet system and a carrier tube for the target. It is provided according to the invention that at least one thermal contact layer (38) is disposed between the carrier tube (36) and the target, which consists of one or more ring(s) (37, 37', 37") shrunk, especially interchangeably, onto the carrier tube (36). During sputtering the cathode (6) and the surface to be sputtered can be subjected to a mutual relative motion in the longitudinal direction of the cathode (6), for which purpose an adjusting element is provided. The magnets (31) are disposed inside the carrier tube (36) with the magnetic fields having alternately opposing directions in the longitudinal direction of the carrier tube (36). They possess cylindrical or polygonal lateral surfaces and end faces (44) which are parallel and slope at an angle ($\alpha$) to the longitudinal direction of the electrode (6) or shaft (30).

18 Claims, 2 Drawing Sheets

BAR-SHAPED MAGNETRON OR SPUTTER CATHODE ARRANGEMENT

The invention relates to a bar-shaped magnetron-sputter cathode arrangement having an internal, cooled permanent magnet system and a carrier tube for the target, which is deposited on the bar-shaped carrier tube, which preferably consists of non-magnetic steel, and is composed as appropriate of different target materials. Arrangements of this type serve especially for sputtering at least partially curved surfaces or inner surfaces of bodies which are hollow or assembled from parts so as to be hollow, for example cylinder inner surfaces, polygonal or rosette-shaped inner surfaces, or the like. The invention further relates to a sputtering process for sputtering with a magnetron or sputter cathode arrangement, preferably for sputtering surfaces having curved areas, for example the inner surfaces of hollow bodies, and also an apparatus for carrying out this process, and a tubular target.

An etching or coating device having a hollow cathode with parallel electrode faces is known from the U.S. Pat. No. 4,521,286; a bar-shaped magnetron-sputter cathode arrangement is not extant.

A magnetron-sputter cathode arrangement of the type mentioned at the beginning is known from European Pat. No. 1 70 899, which is used for sputtering plane surfaces. Moreover, it is provided in this arrangement that the surface to be sputttered is moved perpendicularly to the axis of the fixed cathode arrangement, which includes a carrier tube on which the different target materials are deposited, and that the carrier tube is especially continuously rotatable about its longitudinal axis, so that, for example, different materials, which are disposed in different sectors can be brought consecutively into position in front of the permanent magnet system, which is disposed inside only in a particular sector, and is U-shaped and cooled.

It is the object of the invention to render accessible to a high-performance sputtering process materials which, for reasons of strength, are unsuitable for the preparation of self-supporting targets, and arbitrary combinations of materials, which can be manufactured not at all or only with difficulty using other processes (for example, galvanic, melt-metallurgical or powder-metallurgical), to improve the structural formation of the sputtered layers, for example, on the inner surface of bearing shells, or to enhance the adhesion of such layers. Moreover, the problems are to be solved which arise because of the different thermal expansion of target material and carrier tube, and of the often insufficient heat dissipation from the target material. Problems of heat dissipation often arise in the use of bar-shaped cathodes of small diameter.

This object is achieved with a bar-shaped magnetron or sputter cathode arrangement of the type mentioned at the beginning in that at least one thermal contact layer is disposed between the carrier tube and the target, which consists of one or more ring(s) shrunk especially interchangeably, onto the carrier tube.

The metal thermal contact layer disposed between the carrier tube and the rings of target material enables an optimum heat transfer from the target material, as heated by the gas discharge, to the carrier tube, and from there to a coolant flowing between the carrier tube and the permanent magnet system. This ensures that the target material is sufficiently cooled, i.e. does not melt at an appropriately high power density. This makes it possible to use a thicker target material as well, so that the useful lives of the arrangement are increased.

Because of the mode of procedure according to the invention, it is no longer necessary to manufacture the cathode entirely from target material, it being possible, instead, to deposit on the carrier tube arbitrary target materials, for example including such as have low mechanical strength which are not suitable for the production of self-supporting targets. The sputter cathode arrangement according to the invention makes it possible for the the first time to produce with the aid of a bar cathode layers made from alloys for which the manufacture of annular targets using melt or sinter technologies was possible not at all or only with the greatest difficulty. Different thermal expansions of the target material and carrier tube are absorbed by the thermal contact layer.

Given that permanent magnets are disposed in the interior of the carrier tube around its longitudinal axis, being especially continuously rotatable, for example carried by a rotatable shaft, and surrounded by a flowing cooling medium, it is preferred that the magnets are disposed inside the carrier tube with their magnetic field having alternately opposing direction in the longitudinal direction of the carrier tube. This construction of the cathode arrangement or of the permanent magnet system enables even processing or eroding of the target material during sputtering, and therefore a better exploitation of the target material, as well as an even deposition of the layer for the surfaces to be sputtered. In this connection, it is advantageous if the magnets, which possess cylindrical or polygonal lateral surfaces, possess end faces (44) which are parallel and slope at an angle to the longitudinal direction of the electrode or shaft, the facing end faces of sequential magnets having opposing magnetic poles.

Cooling the target material is especially important in enabling a high power density on the target surface during continuous operation. For this purpose, it is provided according to the invention that the magnets have a tubular cutout in the longitudinal direction of the carrier tubes, by means of which they are pushed onto the shaft as appropriate, in that the cutout or the shaft constructed a a hollow shaft is constructed as a coolant throughflow and connected to a coolant supply device, and in that the magnets are disposed in the carrier tube so as to form a gap, the gap between the carrier tube and the magnets, which are surrounded by an enveloping tube as appropriate, being constructed as coolant throughflow, especially as coolant return line. Given the predetermined coolant rate, the resultant annular flow cross-section is to produce a Reynolds number of >10,000 for the cooling medium. The thickness of the annular gap between the magnets or the enveloping tube and the carrier tube can amount to approximately 0.5 mm, and a cooling water pressure circulation is formed having a pressure of 12 bar. It is possible to provide in the end region of the hollow shaft a shell-shaped deflection favorable to flow for the coolant emerging from the hollow shaft, in order to deflect the former into the cooling gap.

In order to achieve the high sputtering power density at the target, it is necessary for the plasma to be confined magnetically in the immediate vicinity of the target surface. This necessitates an effective magnetic field strength parallel to the cylinder surface of the target material of preferably 300 Gauss. This field is generated by the magnets, which preferably consist of SmCO$_5$. Because of the special configuration of the individual rotating sequential magnets, when averaged over time the result is an even density of the plasma on a cylindrical surface surrounding the target surface. As a consequence, the target is eroded evenly. Thus, it is possible, for example, to use the bar cathode according to the invention to achieve a rate of coating of 1 μm/min aluminum at a distance of 30 mm from the target surface, a performance which already lies beyond the limit of commercial high-performance plane cathodes, and far exceeds the performance of known bar cathodes.

It is advantageous if the preferably 5-50 μm, especially 10-20 μm, thick thermal contact layer disposed between the ring(s) and the carrier tube consists of a highly thermally conductive metal of low melting point which is soft or formable, especially having a hardness of <20 MHV, or of such an alloy, for example In, Ga, Pb, Sn, or the like, which is preferably deposited onto the carrier tube. If the thermal contact layer possesses a larger expansion coefficient than do the rings shrunk onto the carrier tube, then when the cathode is heated no interspaces impeding the dissipation of heat are formed. At the same time, however, it is necessary for the metal of the thermal contact layer to be soft, in order to be able to absorb the resultant stresses when being formed. It is particularly advantageous if for the thermal contact layer a metal is used which melts at temperatures below the softening point, especially the melting point, of the particular target material, and therefore re-establishes the thermal closure by remelting of the layer and afterflow of the layer material into areas where local overheating of the target material has occurred owing to locally poor thermal contact. Since the rings are advantageously mounted onto the carrier tube by means of a force fit, even when the metal is not molten there is optimum heat transfer because of the good formability of the metal of the layer.

In order to construct layers from more than one individual component it is advantageous if rings as appropriate of different widths and different target materials, are shrunk onto the carrier tube sequentially in the axial direction, especially in a predetermined sequence.

A tubular target, especially for a sputter cathode having a carrier tube is characterized according to the invention in that between the carrier tube of the tubular target and the target material there is provided at least one preferably 5-50 μm, especially 10-20 μm, thick thermal contact layer of highly thermally conductive metal of low melting point which is soft or formable, especially having a hardness of <20 MHV, or of an appropriate alloy, for example In, Ga, Pb, Sn, Wood's metal, or the like, at least one, preferably a number of sequential ring(s), consisting as appropriate of different target materials and possessing as appropriate different widths is mounted on the carrier tube in the axial direction, the ring(s) being shrunk onto the carrier tube preferably in a warm state and disposed with a force fit on the carrier tube or the thermal contact layer when in the operating condition after cooling, the metal of the layer(s) having as appropriate a coefficient of thermal expansion which exceeds that of the target material.

The sputtering process according to the invention is suitable for sputtering surfaces having curved areas, for example the inner surfaces of hollow bodies. The surfaces to be sputtered and the cathode arrangement that includes a carrier tube on which different target materials are deposited are subjected to a mutual relative motion with the cathode arrangement preferably being held fixed and the surface or the body carrying the surface being moved. The carrier tube has more than one ring of different shrunk target material located sequentially along the axial direction of the carrier tube. The surfaces to be sputtered are subjected to a mutual relative motion in the longitudinal direction of the cathode arrangement or of the carrier tube. In this connection, it can be provided that the relative motion between the cathode arrangement and the surface to be sputtered is an oscillating motion, the throw of which is chosen to be larger than the width of a, especially the widest occurring, ring of target material or that the relative motion is a traversing motion and includes an advancing motion of the body carrying the surface to be sputtered in relation to the longitudinal direction of the cathode arrangement on which is superimposed an oscillating motion. In this way, the local differences in concentration produced by the target segmentation or by sequentially disposed rings of different target materials are compensated as the layer is built up, and an evenly composed layer of the desired alloy is achieved.

An apparatus for carrying out this process having an adjusting element, wherein the cathode arrangement and/or the surface to be sputtered is carried by or connected to the adjusting element, which is formed by a carrier device executing an advancing and/or reciprocating motion (oscillating motion) in the longitudinal direction of the carrier tube and can be actuated as appropriate with a conveying or driving device. The conveying or driving device for the surface to be sputtered and/or for the body carrying the surface can be connected to the adjusting element, which is disposed, for example, outside the vacuum chamber in which the sputtering process takes place, and effects the adjustment of the body and/or of the surface to be sputtered during the sputtering via vacuum-tight drives or setting devices.

Further advantageous embodiments of the invention are to be derived from the following description, the drawing and the patent claims.

The invention is explained below with reference to the drawing, in which.

Figure 1:
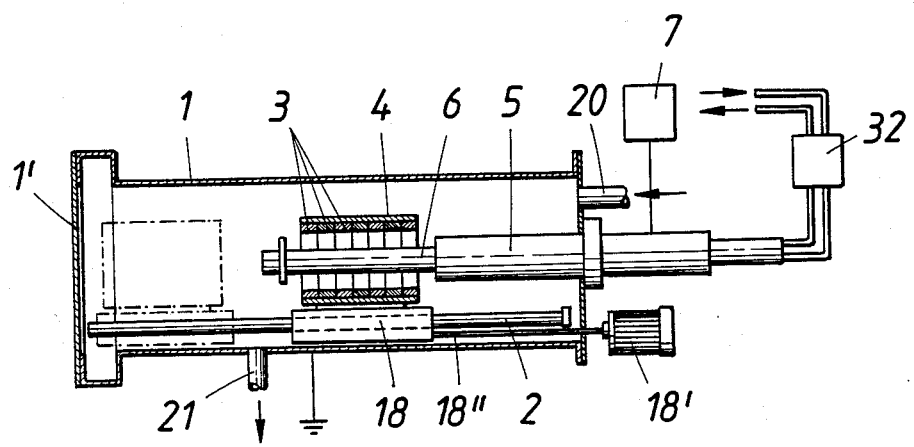
FIG. 1 shows a sputtering station.

The cathode arrangement according to the invention and the process according to the invention can be employed especially well for sputtering bearing shells having alloy bearing layers. Accordingly, the invention is explained with reference to the example of the coating of bearing shells by means of cathode sputtering. Other applications are, for example, the sputtering of ball bearing running surfaces, tube inner surfaces, etc.

The bearing shells, advantageously joined together in a row to form a cylinder, are inserted into a carrier 4, which may be put into a coating apparatus. A sputtering apparatus of this type is shown schematically in FIG. 1. The arrangement comprises a gas-tight vacuum chamber 1 having a cover part 1' which can be screwed on. Provided in the vacuum chamber 1 are conveying devices, for example a carrier 18 which can be moved on guides 2, on or by means of which the carrier 4 with the bearing shells 3 can be moved between a charge or discharge position (broken line) and a sputtering position, in which the sputter cathode 6 supported by holder 5 is enveloped by the bearing shells 3. After completion of the sputtering process, the carrier 4 is removed from the vacuum chamber.

The numeral 20 denotes a gas supply line and 21 a line to a vacuum pump. The voltage connection (for example −600 V) of the sputter cathode 6 is denoted by 7, the cooling water supply means of the cathode 6 by 32. Sputtering takes place at a temperature of the target material from 30° to 100° C., preferably at 80° C., and a pressure of approximately $2.10^{-3}$ mbar.

Figure 2:
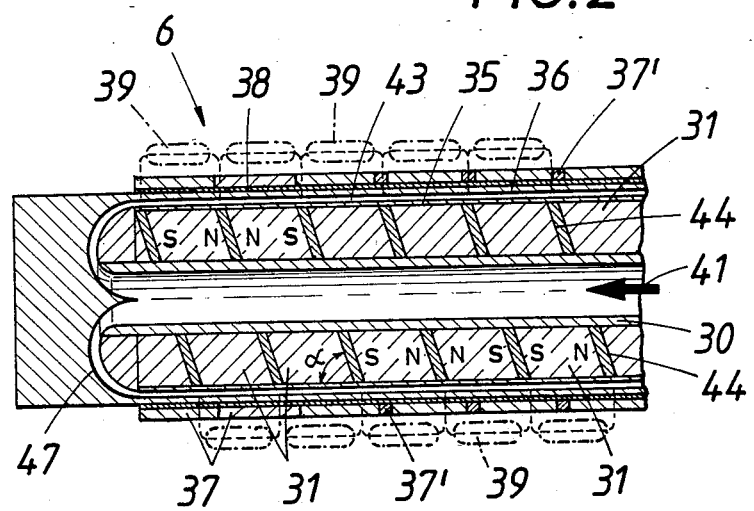
FIG. 2 shows a preferred embodiment of a sputter cathode arrangement according to the invention.

A cathode arrangement 6 according to the invention, as represented in FIG. 2 in a section through its longitudinal axis, includes permanent magnets 31 disposed on a hollow shaft 30. In the present case, the magnets are of cylindrical design, but could also have a polygonal cross-section. The magnets 31 are cut at a slant of angle α to the longitudinal axis of the cathode arrangement 6, and therefore have inclined end faces 44. It is advantageous for the angle α to amount to 45° to 75°. The magnets 31 are magnetized in such a way that their poles lie in the end faces 44, doing so in a way that the direction of magnetization runs parallel to the longitudinal axis of the cathode arrangement 6. Moreover, sequential magnets 31 are disposed in such a way that in each case opposing magnetic poles are turned toward one another.

The magnets 31 generate a stray magnetic field, which causes an annular plasma confinement 39 running at an angle to the longitudinal axis to form in front of the inner surface of the bearing 19. The rotation of the magnets causes a rotation of the plasma zones, an even sputtering away of the target surface being achieved through this tumbling motion.

The magnets are disposed in a thin enveloping tube 35, and surrounded by a target carrier tube 36, onto which are shrunk rings 37, 37' of target material. Between the rings 37, 37' of target material and the carrier tube 36 there is disposed a thermal contact layer 38 consisting of a soft, formable, highly thermally conductive metal of low melting point, for example indium, gallium, lead or the like. Moreover, this material is to have a coefficient of thermal expansion which exceeds that of the target material. The number, the material, the width and the thickness of the rings are determined by the particular application.

The hollow shaft 30 with the magnets 31 cut at an angle is disposed rotatively inside the carrier tube 36. Between the rings 37, 37' and the inner surface 19 of the bearing 3, which are disposed in the carrier 4 in rows, a gas discharge takes place and the particles eroded from the target material are deposited on the surface 19.

Cooling medium 41, preferably water, is fed through the hollow shaft 30 from a coolant supply device 32, and, passing through the hollow shaft 30, reaches a deflection element 47 in the shape of a shell or half torus, by means of which the cooling medium 41 is led from the hollow shaft 30 into a cylindrical gap 43 between the magnets 31 or the enveloping tube 35 and the carrier tube 36. Emerging from the gap 43, the water is led away from the cathode arrangement 6.

The outer surface of the magnets 31, the outer or inner surface of the carrier tube 36, and the cross-sectional form of the rings can be constructed cylindrically or in the form of a polygon with the highest possible number of corners.

Figure 3:
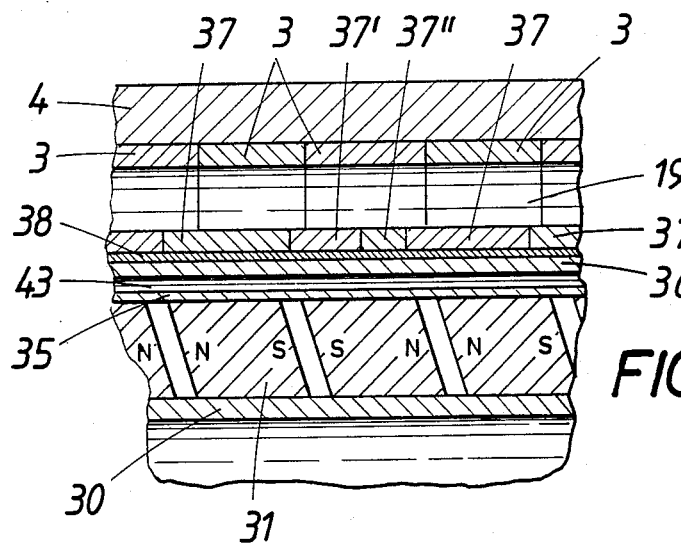
FIG. 3 shows a detail of a section through a sputter cathode arrangement and FIG. 4 shows a view of a carrier tube according to the invention.

FIG. 3 shows a section of the concentric arrangement of the bearing to be coated and of the sputter cathode arrangement. Between the carrier tube 36 and the rings 37, 37', 37" of different target material there is provided a preferably 5–50 μm, especially 10–20 μm, thick thermal contact layer 38 consisting of a soft, highly thermally conductive metal of low melting point, for example In, Ga, Pb or the like. This layer has a hardness of especially <20 MHV, and a melting point which is lower than the softening or melting temperature of the particular target material. The sequential rings 37, 37', 37" of different target materials, as appropriate, are preferably shrunk onto the carrier tube 36 in a warm state, and, after cooling, are located with a force fit on the carrier tube 36 or the formable thermal contact layer 38. The rings may have different widths, but preferably possess the same wall thickness. The representation of FIG. 2 shows narrow Pb rings 37' between wide Al rings 37, an arrangement with which Al-Pb alloys may be sputtered.

It is also possible to provide more than one superimposed thermal contact layer 38, or instead of pure metal for the layer 38 it is also possible to use alloys, for example Wood's metal, Sn-Pb alloys, etc. It is also possible to shrink only one ring or cylinder onto a target tube 36.

Figure 4:
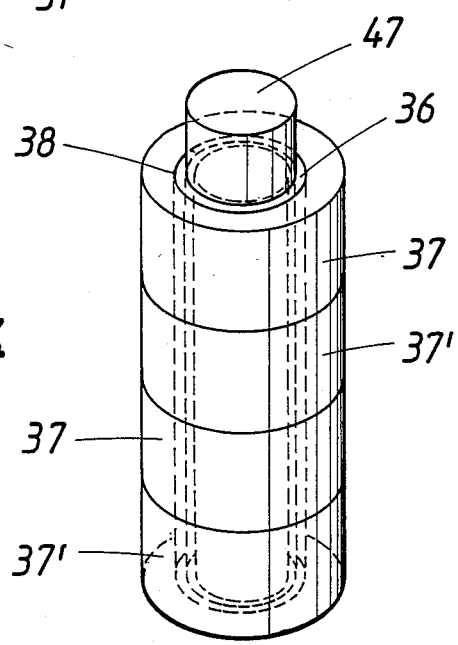

FIG. 4 shows a view of a carrier tube 36, which carries alternating rings 37 or 37' of different materials, may be fitted onto the permanent magnet system, and is secured in the holder 5.

The numeral 18 in FIG. 1 indicates an element with which the carrier 4 carrying the bearing shell 3 may be displaced on guiding means 2, for example rails, in a relative motion to the carrier tube 36, especially in advancing and/or reciprocating motion or oscillating motion in the longitudinal direction of the cathode arrangement 6 and/or in a rotation about the latter. With motions of this type it is possible to even out the sputtering of alloy layers with contiguous rings 37, 37', 37" of different materials. The numeral 18' indicates a driving device disposed outside the vacuum chamber 1, for example a motor, and the numeral 18" denotes vacuum-tight operated power transmission means, for example rods, shafts or the like, for the element 18, for example a slide movable on rollers on the rails 2.

It is preferred to use the cathode arrangement according to the invention for the internal coating of hollow bodies, for example also of ferromagnetic materials, since, for example, the latter cannot be coated with a sputtering process using a magnetic field generated outside the cathode, because of its screening effect.

The carrier tube 36 can, for example, have a wall thickness of 1–10 mm. The enveloping tube 35 around the magnets 31 can be 0.5–2 mm thick. The width of the cooling gap 43 amounts to between 0.3 to 10 mm. The magnets 31 have a diameter of approximately 5–50 mm. The rotation of the magnets takes place at approximately 60–1,200 r.p.m. The entire throw of an oscillating motion can amount to approximately 50 mm, the oscillating frequency to 1 Hz, for example, and the rate of advance to approximately 1 cm/min.

It remains to note that the magnets 31 need not necessarily be carried by a hollow shaft 30, or be surrounded by an enveloping tube 35. Also conceivable are ring magnets, which are stuck together, and through whose hollow shaft 30. It is also possible in principle to lead the coolant through the gap 43; however, a better heat dissipation is achieved in the case described according to the invention.

It is also possible to deposit the intermediate layer 38 onto the inner surface of the rings 37, 37', 37", to shrink the carrier tube 36 by cooling, for example in liquid air, and to shrink the rings 37, 37', 37" onto the shrunk carrier tube 36, having heated them, as appropriate, to below the melting point of the intermediate layer 38. The carrier 4 can take the form of a tube, as appropriate of one piece, surrounding the bearing 3.

Electrically non-conductive materials, for example plastic, ceramics, glass etc., also come into consideration as target material. The term "sputtering" is also understood to include so-called "reactive" sputtering, as well as so-called RF-sputtering, which takes place by means of an RF (radio-frequency) field in the discharge chamber.

We claim:

1. Bar-shaped magnetron-sputter cathode arrangement having an internal, cooled permanent magnet system and a carrier tube for a target which is deposited on the bar-shaped carrier tube, which comprises a non-magnetic steel, and which comprises appropriate different target materials, wherein at least one thermal contact layer is disposed between the carrier tube and the target, and the target comprises one or more rings shrunk onto the carrier tube, the thermal contact layer comprising a solid, highly thermally conductive metal or alloy.

2. Arrangement as claimed in claim 1, wherein the thermal contact layer disposed between the rings and the carrier tube has a thickness in the range from about 5 μm to about 50 μm and has a low melting point and is soft and formable, the metal or alloy having a hardness of <20 MHV.

3. Arrangement as claimed in claim 2, wherein the melting point of the metal or alloy of the thermal conducting layer lies at temperatures below the softening point or melting point of the deposited target material.

4. Arrangement as claimed in claim 2, wherein the metal or alloy of the thermal contact layer has a coefficient of thermal expansion which exceeds that of the target material.

5. Arrangement as claimed in claim 1, wherein the rings are mounted while warm onto the carrier tube and are located with a force fit on the thermal contact layer.

6. Arrangement as claimed in claim 1, wherein the rings can have different widths and are shrunk onto the carrier tube sequentially in the axial direction in a predetermined sequence.

7. Arrangement as claimed in claim 1, in which permanent magnets are disposed in the interior of the carrier tube around its longitudinal axis, the magnets being continuously rotatable and surrounded by a flowing cooling medium, the magnets being disposed inside the carrier tube such that their magnetic fields are provided in alternately opposing directions in the longitudinal direction of the carrier tube.

8. Arrangement as claimed in claim 7, wherein the magnets have cylindrical or polygonal lateral surfaces and end faces which are parallel and slope at an angle with respect to the longitudinal direction of the cathode, and wherein facing end faces of sequential magnets have opposing magnetic poles.

9. Arrangement as claimed in claim 7, wherein the magnets have a tubular cutout in the longitudinal direction of the carrier tube by which they are pushed onto a shaft, the shaft being hollow to provide a coolant throughflow connected to a coolant supply device, and the magnets are disposed in the carrier tube so as to form a gap between the carrier tube and the magnets, the gap being surrounded by an enveloping tube constructed as a coolant return line.

10. Arrangement as claimed in claim 1, wherein the thermal contact layer has a thickness in the range from about 10 μm to about 20 μm.

11. Arrangement as claimed in claim 1, wherein the metal or alloy comprises In, Ga, Pb, Sn, or Wood's metal.

12. Sputtering process for sputtering with a magnetron or other type sputter cathode arrangement, such process being suitable for sputtering surfaces having curved areas such as the inner surfaces of hollow bodies, such process comprising the steps of:

relatively moving the surfaces to be sputtered and a sputtering cathode arrangement that includes a carrier tube on which different target materials are deposited, the carrier tube having a plurality of rings of different target materials shrunk thereon sequentially in the axial direction of the carrier tube, the cathode arrangement being held fixed and the surface or the body carrying the surface being moved, the cathode arrangement and the surfaces to be sputtered being subjected to a mutual relative motion in the longitudinal direction of the carrier tube of the cathode arrangement.

13. Process as claimed in claim 12, wherein the relative motion between the cathode arrangement and the surface to be sputtered is an oscillating motion, the throw of which is chosen to be larger than the width of the widest ring of target material.

14. Process as claimed in claim 12, wherein the relative motion is a traversing motion and includes an advancing motion of the body carrying the surface to be sputtered in relation to the longitudinal direction of the cathode arrangement on which is superimposed an oscillating motion.

15. Tubular target, adapted for use with a bar-shaped magnetron or sputter cathode arrangements having a carrier tube for the target material, wherein between the carrier tube of the tubular target and the target material there is provided at least one thermal contact layer which has a thickness of about 5 μm to about 50 μm and which comprises a solid highly thermally conductive metal having a low melting point and a hardness of <20 MHV, at least one ring comprising an appropriate target material being mounted on the carrier tube in the axial direction, the ring being shrunk onto the carrier tube while warm and disposed with a force fit on the thermal contact layer, the metal of the thermal contact layer having a coefficient of thermal expansion which exceeds that of the target material.

16. Target as claimed in claim 15, wherein the thermal contact layer has a thickness in the range from about 10 μm to about 20 μm.

17. Target as claimed in claim 16, comprising a number of sequential rings including different target materials and having different widths.

18. Apparatus for carrying out a sputtering process with a sputter cathode arrangement:

the sputter cathode arrangement comprising a carrier tube on which different target materials are deposited, the carrier tube having a plurality of rings of different target materials shrunk thereon sequentially and in the axial direction of the carrier tube and a thermal contact layer provided between the carrier rod and the rings, the contact layer comprising a solid, highly thermal conductive metal or alloy; and for carrying either the cathode arrangement or the surface to be sputtered, said means being formed by a carrier device which executes a reciprocating motion in the longitudinal direction of the carrier tube and which can be actuated by a driving device whereby the surface to be sputtered and the sputter cathode arrangement are relatively moved along the longitudinal direction of the carrier tube.

* * * * *